United States Patent
Suto et al.

(10) Patent No.: US 10,312,286 B2
(45) Date of Patent: Jun. 4, 2019

(54) MAGNETIC SENSOR INCLUDING RESISTOR ARRAY INCLUDING A PLURALITY OF RESISTIVE ELEMENT SECTIONS EACH HAVING MAGNETORESISTANCE ELEMENT

(71) Applicant: TDK Corporation, Tokyo (JP)

(72) Inventors: Toshihide Suto, Tokyo (JP); Hiraku Hirabayashi, Tokyo (JP)

(73) Assignee: TDK Corporation, Tokyo (JP)

(*) Notice: Subject to any disclaimer, the term of this patent is extended or adjusted under 35 U.S.C. 154(b) by 51 days.

(21) Appl. No.: 14/982,059

(22) Filed: Dec. 29, 2015

(65) Prior Publication Data

US 2016/0204161 A1  Jul. 14, 2016

(30) Foreign Application Priority Data

Jan. 14, 2015  (JP) ................ 2015-004968

(51) Int. Cl.
   *G01R 33/09*  (2006.01)
   *H01L 27/22*  (2006.01)
   *H01L 43/02*  (2006.01)
   *H01L 43/08*  (2006.01)

(52) U.S. Cl.
   CPC .......... *H01L 27/222* (2013.01); *G01R 33/093* (2013.01); *G01R 33/098* (2013.01); *H01L 43/02* (2013.01); *H01L 43/08* (2013.01)

(58) Field of Classification Search
   CPC ...... G01R 33/206; G01R 33/28; G01R 33/38; G01R 33/1215; G01R 33/213; G01R 33/45

USPC ................ 324/252, 251, 250, 244
   See application file for complete search history.

(56) References Cited

U.S. PATENT DOCUMENTS

| | | | | |
|---|---|---|---|---|
| 5,561,368 A * | 10/1996 | Dovek | ................ | B82Y 25/00 324/252 |
| 6,100,686 A * | 8/2000 | Van Delden | .......... | B82Y 10/00 324/207.12 |
| 6,304,074 B1 * | 10/2001 | Waffenschmidt | ....... | G01B 7/30 324/202 |
| 7,064,558 B1 * | 6/2006 | Bentley | .................... | G01D 3/02 324/610 |
| 7,907,720 B2 * | 3/2011 | Lantoine | ............... | H04M 3/005 379/22 |

(Continued)

FOREIGN PATENT DOCUMENTS

| | | |
|---|---|---|
| CN | 102298124 A | 12/2011 |
| DE | 103 42 260 A1 | 4/2005 |

(Continued)

OTHER PUBLICATIONS

Office Action dated Dec. 6, 2018 issued in corresponding DE patent application No. 10 2016 100 423.5 (English translation only).

*Primary Examiner* — Tung X Nguyen
*Assistant Examiner* — Dominic E Hawkins
(74) *Attorney, Agent, or Firm* — Posz Law Group, PLC

(57) ABSTRACT

A magnetic sensor for detecting a component of an external magnetic field in a specific direction includes a resistor array including a plurality of resistive element sections each having a magnetoresistance element. Each of the plurality of resistive element sections has a different output characteristic curve with respect to the component of the external magnetic field in the specific direction.

11 Claims, 10 Drawing Sheets

(56) References Cited

U.S. PATENT DOCUMENTS

| | | | |
|---|---|---|---|
| 8,587,299 B2* | 11/2013 | van Veldhoven | G01R 33/096 324/207.21 |
| 9,123,876 B2* | 9/2015 | Deak | G01B 7/30 |
| 9,316,706 B2* | 4/2016 | Granig | G01R 33/093 |
| 9,377,327 B2* | 6/2016 | Kubik | G01D 5/16 |
| 9,678,178 B2* | 6/2017 | Bai | G01R 33/09 |
| 2002/0006017 A1 | 1/2002 | Adelerhof | |
| 2007/0047152 A1* | 3/2007 | Furukawa | B82Y 25/00 360/319 |
| 2008/0191694 A1 | 8/2008 | Barton et al. | |
| 2009/0302837 A1 | 12/2009 | Phan Le et al. | |
| 2010/0001723 A1* | 1/2010 | Van Zon | G01R 33/09 324/252 |
| 2011/0025318 A1* | 2/2011 | Saruki | G01R 33/0023 324/252 |
| 2011/0025319 A1* | 2/2011 | Saruki | G01R 33/0029 324/252 |
| 2012/0119729 A1 | 5/2012 | Komasaki et al. | |
| 2013/0328556 A1* | 12/2013 | Granig | G01R 33/093 324/252 |
| 2013/0334634 A1* | 12/2013 | Deak | G01B 7/30 257/427 |
| 2014/0035570 A1 | 2/2014 | Jin et al. | |
| 2014/0054733 A1 | 2/2014 | Deak et al. | |

FOREIGN PATENT DOCUMENTS

| | | |
|---|---|---|
| DE | 10 2012 208 404 A1 | 11/2013 |
| EP | 2 284 555 A1 | 2/2011 |
| JP | 63-274817 A | 11/1988 |
| JP | 04-160315 A | 6/1992 |
| JP | 07-092199 A | 4/1995 |
| JP | 08-285509 A | 11/1996 |
| JP | 09-016293 A | 1/1997 |
| JP | 2000-055997 A | 2/2000 |
| JP | 2004-504713 A | 2/2004 |
| JP | 2007-64813 A | 3/2007 |
| JP | 2008-516225 A | 5/2008 |
| JP | 2012-107963 A | 6/2012 |
| JP | 2014-512003 A | 5/2014 |
| JP | 2014-517264 A | 7/2014 |
| WO | 2013/174542 A1 | 11/2013 |

* cited by examiner

External magnetic field ability. For this purpose, measures to improve the linearity of the output signal (voltage) with respect to the input signal (the specific direction component of the external magnetic field) have been taken.
MAGNETIC SENSOR INCLUDING RESISTOR ARRAY INCLUDING A PLURALITY OF RESISTIVE ELEMENT SECTIONS EACH HAVING MAGNETORESISTANCE ELEMENT

BACKGROUND OF THE INVENTION

Field of the Invention

The present invention relates to a magnetic sensor using a magnetoresistance element, and more particularly, to a magnetic sensor including a resistor array including a plurality of resistive element sections each having a magnetoresistance element.

Description of the Related Art

In recent years, a magnetic sensor using a magnetoresistance (MR) element has been used as a sensor for detecting the position of a movable body (see, for example, JP 63-274817 A, JP 04-160315 A, JP 08-285509 A, and JP 09-016923 A).

Each of the disclosed magnetic sensors is configured such that the output of the magnetic sensor changes when a specific direction component of an external magnetic field generated by, for example, a magnet that is installed in the movable body changes in response to a positional change of the movable body relative to the magnetic sensor. Thus, the specific direction component of the external magnetic field is detected, and thereby the position of the movable body can be detected.

For high accuracy detection of the moving body's position, the specific direction component of the external magnetic field needs to be detected with a high degree of accuracy. For this purpose, measures to improve the linearity of the output signal (voltage) with respect to the input signal (the specific direction component of the external magnetic field) have been taken.

As one of the measures, there is known a method in which the output characteristic curve of the MR element (characteristic curve of the resistance of the MR element with respect to the external magnetic field) is changed by applying an external bias magnetic field to the MR element to improve the linearity in the non-saturation region of the output of the MR element (see, for example, JP 07-092199 A).

The above-described method is a method in which the linearity of the output of the MR element is improved by sacrificing the MR ratio. That is, the linearity of the output and the MR ratio are in a trade-off relation. Therefore, when the linearity of the output of the MR element is improved so that the accuracy of detection of the magnetic field can be improved, the MR ratio is greatly reduced. As a result, the magnetic field detection sensitivity is significantly reduced.

SUMMARY OF THE INVENTION

The present invention is directed to a magnetic sensor including a resistor array including a plurality of resistive element sections each having a magnetoresistance element. An object of the present invention is to provide a magnetic sensor capable of improving the linearity of the output while minimizing any reduction in magnetic field detection sensitivity.

According to one aspect of the present invention, a magnetic sensor for detecting a component of an external magnetic field in a specific direction includes a resistor array including a plurality of resistive element sections each having a magnetoresistance element, wherein each of the plurality of resistive element sections has a different output characteristic curve with respect to the component of the external magnetic field in the specific direction.

In such magnetic sensor, the output waveform of the resistor array is obtained by superimposing different output waveforms of the magnetoresistance (MR) elements of the resistive element sections. As a result, the linear region in the output characteristic curve of the resistor array can be expanded as compared with the case of a resistor array having a single MR element. Further, as compared with the case where the output characteristic curve of the resistor array is changed by a bias magnetic field, the change in the output characteristic curve of the resistor array can be minimized, which does not result in a significant reduction in the MR ratio.

As described above, the magnetic sensor capable of improving the linearity of the output while minimizing any reduction in magnetic field detection sensitivity can be provided.

The above description, as well as other objects, features, and advantages of the present invention, will be evident by the description that follows below with reference to attached drawings exemplifying the present invention.

DETAILED DESCRIPTION OF THE PREFERRED EMBODIMENTS

In the following, an embodiment according to the present invention will be described with reference to the accompanying drawings.

In this specification, a magnetic sensor of the present invention will be described by taking a configuration using a half-bridge circuit as an example. However, the configuration of the magnetic sensor is not limited to this. The present invention can also be applied to, for example, a magnetic sensor using a full-bridge circuit.

Figure 1:
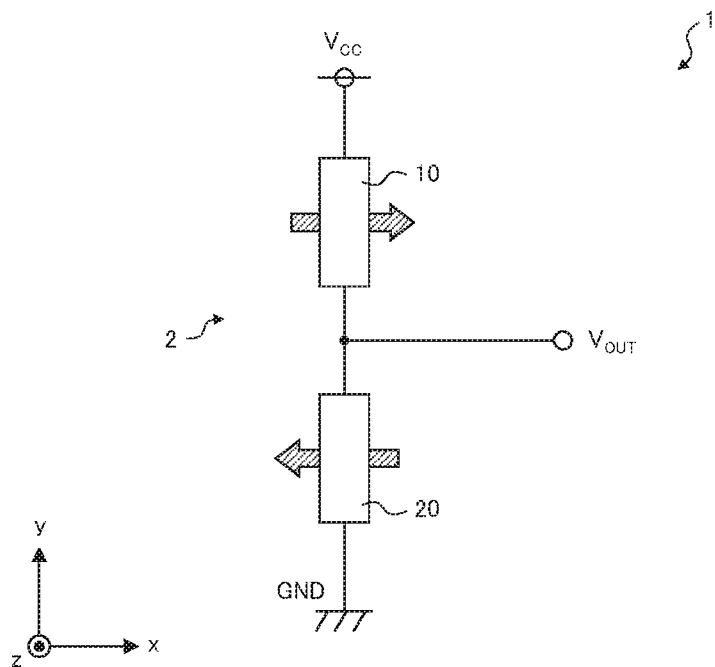
FIG. 1 is a diagram showing a circuit configuration of a magnetic sensor according to an embodiment of the present invention.

FIG. 1 is a diagram showing a circuit configuration of a magnetic sensor according to an embodiment of the present invention.

Magnetic sensor 1 of this embodiment includes half-bridge circuit 2 composed of a series circuit of first resistor array 10 and second resistor array 20. In half-bridge circuit 2, one end of first resistor array 10 and one end of second resistor array 20 are connected to each other. Further, the other end of first resistor array 10 is connected to power source terminal $V_{CC}$, and the other end of second resistor array 20 is connected to ground terminal GND. Output terminal $V_{OUT}$ is connected to the connection point of first and second resistor arrays 10 and 20. In half-bridge circuit 2, a potential difference between output terminal $V_{OUT}$ and ground terminal GND is outputted as an output voltage.

Figure 2:
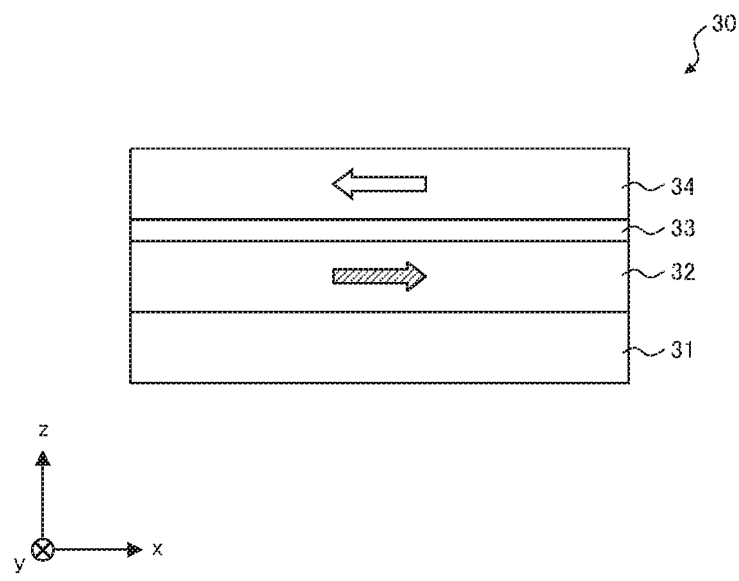
FIG. 2 is a schematic sectional view of an MR element of this embodiment.
Figure 3A:
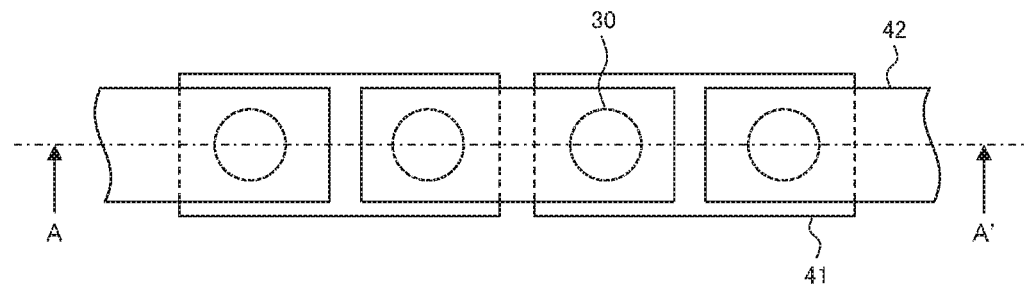
FIG. 3A is an enlarged schematic plan view showing a part of a resistor array of this embodiment.
Figure 3B:
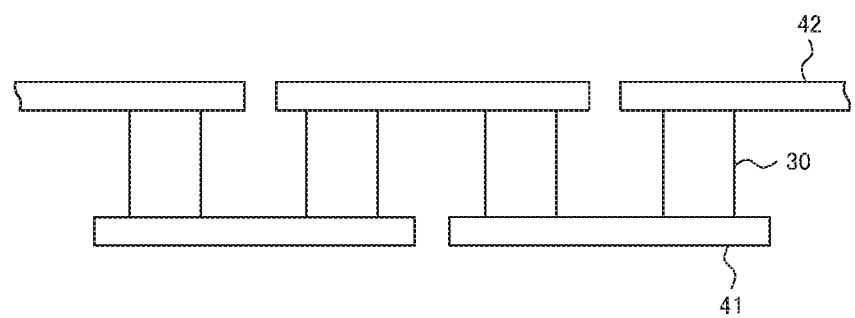
FIG. 3B is an enlarged schematic sectional view showing a part of the resistor array of this embodiment.

Each of resistor arrays 10 and 20 includes a plurality of magnetoresistance (MR) elements each having the same film configuration. A configuration of the MR element will be described below with reference to FIG. 2, FIG. 3A and FIG. 3B. FIG. 2 is a schematic sectional view of the MR element, the view showing a cross-section in a film forming direction. FIG. 3A is an enlarged schematic plan view showing a part of the resistor array, and FIG. 3B is a schematic sectional view taken along line A-A' line of FIG. 3A. It should be noted that the vertical direction in FIG. 3B is the film forming direction of the MR element.

MR element 30 has a typical spin-valve type film configuration. Specifically, as shown in FIG. 2, MR element 30 includes antiferromagnetic layer 31, pinned layer 32 whose magnetization direction is fixed with respect to an external magnetic field, spacer layer 33, and free layer 34 whose magnetization direction changes according to the external magnetic field. Antiferromagnetic layer 31 is a layer which is exchange-coupled with pinned layer 32 to fix the magnetization direction of pinned layer 32. In FIG. 2, the magnetization direction of pinned layer 32 is shown by a hatched arrow. FIG. 2 shows an example in which pinned layer 32 is a single layer made of a ferromagnetic material. However, pinned layer 32 may have a synthetic structure in which a nonmagnetic intermediate layer is interposed between two ferromagnetic layers. Spacer layer 33 is a nonmagnetic conductive layer or a tunnel barrier layer. In the case where spacer layer 33 is a nonmagnetic conductive layer, MR element 30 functions as a giant magnetoresistance (GMR) element. In the case where spacer layer 33 is a tunnel barrier layer, MR element 30 functions as a tunnel magnetoresistance (TMR) element. A bridge circuit including TMR elements can generate a high output voltage because the TMR element has a high MR ratio. In this regard, MR element 30 is preferably a TMR element.

As shown in FIG. 3A and FIG. 3B, each of MR elements 30 is connected to lower electrode 41 and upper electrode 42. Specifically, in each of MR elements 30, antiferromagnetic layer 31 (see FIG. 2) is electrically connected to lower electrode 41 via a conductive buffer layer (not shown), and free layer 34 (see FIG. 2) is electrically connected to upper electrode 42 via a conductive cap layer (not shown). This configuration allows a sense current to flow in the film forming direction of MR element 30. Further, two MR elements 30 are respectively connected to both ends of one of lower electrodes 41 and are respectively connected to two different upper electrodes 42. Thus, a plurality of MR elements 30 are connected in series with each other via a plurality of lower electrodes 41 and a plurality of upper electrodes 42.

Again with reference to FIG. 1 and FIG. 2, an operation of half-bridge circuit 2, whose output changes according to an external magnetic field, will be briefly described.

In MR element 30, the magnetization direction of pinned layer 32 is fixed in a predetermined direction by exchange coupling with antiferromagnetic layer 31, while the magnetization direction of free layer 34 changes according to the external magnetic field, as described above. For this reason, the relative angle between the magnetization direction of free layer 34 and the magnetization direction of pinned layer 32 also changes according to the external magnetic field. Spin-dependent scattering of conduction electrons changes according to the relative angle, and hence a magnetoresistance change occurs in each of MR elements 30.

Further, in each of resistor arrays 10 and 20, the magnetization directions of pinned layers 32 of MR elements 30 are aligned with each other. However, the magnetization directions of pinned layers 32 of MR elements 30 in first resistor array 10 are different from the magnetization directions of pinned layers 32 of MR elements 30 in second resistor array 20. Specifically, as shown by the hatched arrows in FIG. 1, the magnetization direction of pinned layer 32 of each of MR elements 30 in first resistor array 10 is anti-parallel to the magnetization direction of pinned layer 32 of each of MR elements 30 in second resistor array 20. For this reason, the relative angle between the magnetization direction of pinned layer 32 and the magnetization direction of free layer 34 in first resistor array 10 is different from the relative angle between the magnetization direction of pinned layer 32 and the magnetization direction of free layer 34 in second resistor arrays 20. This generates a difference in response (magnetoresistance change) with respect to the external magnetic field between first resistor array 10 and second resistor arrays 20. For example, in the case where the external magnetic field is rotated in the x-y plane, when the resistance of first resistor array 10 is increased, the resistance of second resistor array 20 is reduced.

Therefore, in half-bridge circuit 2 thus configured, when the external magnetic field changes under a condition that the voltage is applied from power source terminal $V_{CC}$ to first resistor array 10 and to second resistor array 20, the output voltage also changes accordingly. From such a relationship between the external magnetic field and the output voltage, the direction and magnitude of the external magnetic field can be determined.

Next, a detailed configuration of the resistor array of this embodiment will be described. The first resistor array and the second resistor array are substantially the same as each other except for the above-described magnetization direction of the pinned layer. Hence, only the configuration of the first resistor array will be described below.

Figure 4:
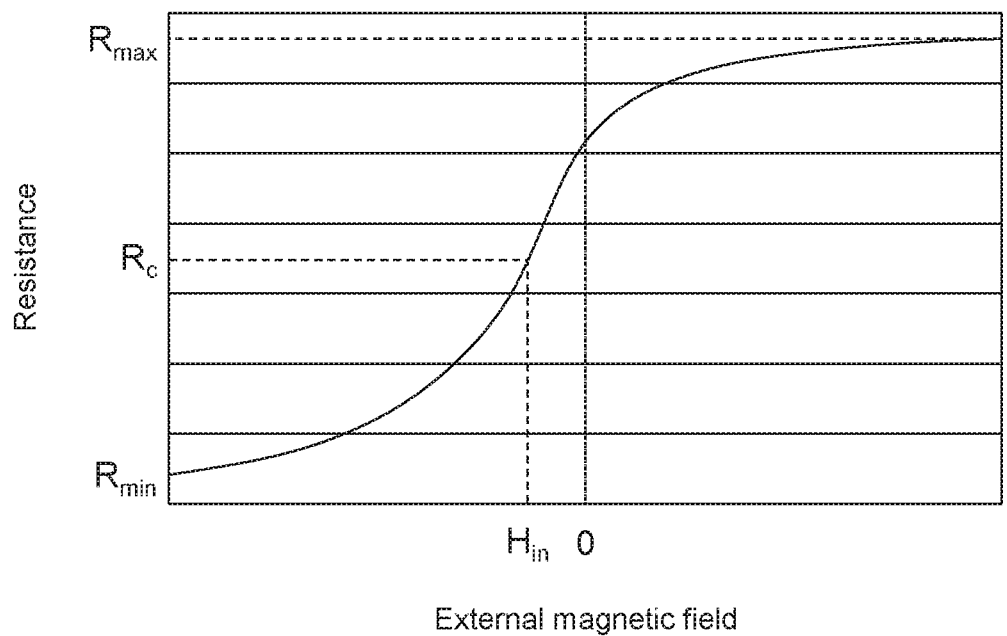
FIG. 4 is a graph showing an example of the relationship between the resistance of the MR element and an external magnetic field.

First, before describing the configuration of the first resistor array, the relationship between the resistance of the MR element and an external magnetic field will be described. FIG. 4 is a graph showing an example of the relationship between the resistance of the MR element shown in FIG. 2 and an external magnetic field. The vertical axis represents the resistance of the MR element (arbitrary unit), and the horizontal axis represents the x-axis component (see FIG. 2) of the external magnetic field (arbitrary unit). It should be noted that the positive value in the horizontal axis means that the external magnetic field has a component in the direction opposite to the magnetization direction (positive x-axis direction in the example shown in FIG. 2) of pinned layer 32. Hereinafter, the x-axis component of the external magnetic field is also referred to simply as "external magnetic field".

When the maximum value and the minimum value of the resistance of MR element 30 are respectively set as $R_{max}$ and $R_{min}$, and when the intermediate value of the maximum value and the minimum value is set as $R_c$ ($=(R_{max}+R_{min})/2$), the resistance of the MR element 30 should ideally be equal to $R_c$ at zero external magnetic field. In practice, however, as shown in FIG. 4, the resistance at zero external magnetic field is shifted from $R_c$. This shift is mainly due to the interlayer coupling magnetic field between pinned layer 32 and free layer 34. Conveniently, the shift can be regarded as being due to magnetic field $H_{in}$ that is anti-parallel to the magnetization direction of the pinned layer and that acts on free layer 34 as shown by the white arrow in FIG. 2. Hereinafter, the magnetic field $H_{in}$ where the resistance of MR element 30 becomes $R_c$ is referred to as "offset magnetic field".

The output characteristic curve of MR element 30, i.e., the behavior of the resistance with respect to the external magnetic field changes according to the magnitude of offset magnetic field $H_{in}$. Therefore, the output characteristic curve of MR element 30 can be controlled by controlling the magnitude of offset magnetic field $H_{in}$. Offset magnetic field $H_{in}$ acting on free layer 34 changes due to various factors, such as the above-described interlayer coupling magnetic field and a shape magnetic anisotropy. In this embodiment, bias magnetic fields whose x-axis components are different from each other are applied to MR elements 30, and thereby the magnitude of offset magnetic field $H_{in}$ is changed for each of MR elements 30. As a result, first resistor array 10 includes therein different types of MR elements 30 that have different output characteristic curves but the same film configuration.

In this embodiment, first resistor array 10 includes a plurality of resistive element sections. Each of the resistive element sections includes MR element 30, and a bias magnetic field generating section which applies a bias magnetic field to free layer 34 of MR element 30. The plurality of resistive element sections can be classified into a plurality of groups of resistive element sections according to the output characteristic curve of MR element 30, i.e., the magnitude of offset magnetic field $H_{in}$ acting on free layer 34. In this embodiment, the plurality of resistive element sections of first resistor array 10 are classified into three groups of resistive element sections.

Figure 5A:
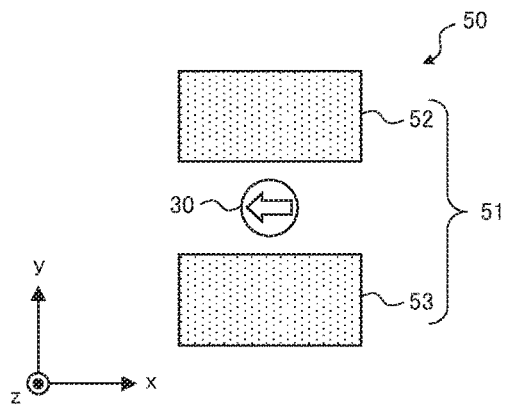
FIG. 5A is a schematic plan view of a first resistive element section of this embodiment.
Figure 5B:
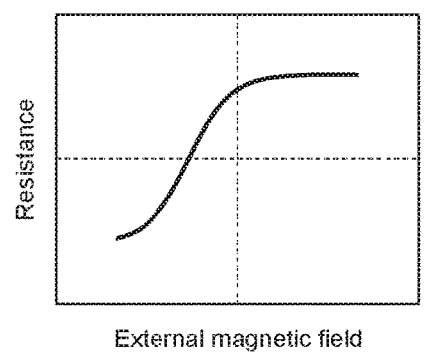
FIG. 5B is a graph schematically showing an output waveform of the MR element in the first resistive element section of this embodiment.
Figure 6A:
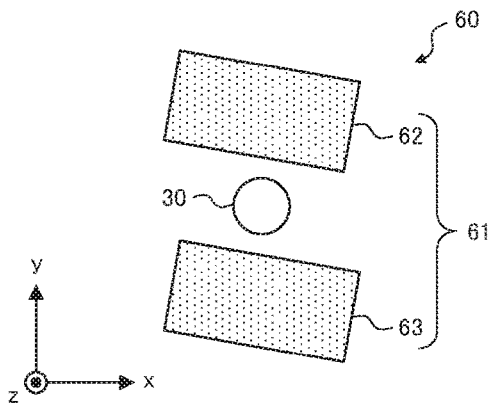
FIG. 6A is a schematic plan view of a second resistive element section of this embodiment.
Figure 6B:
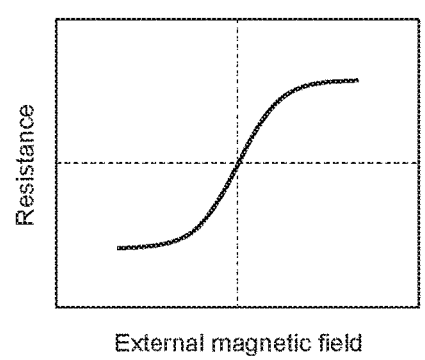
FIG. 6B is a graph schematically showing an output waveform of the MR elements in the second resistive element section of this embodiment.
Figure 7A:
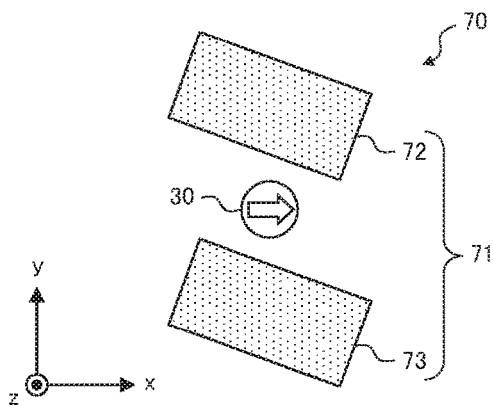
FIG. 7A is a schematic plan view of a third resistive element section of this embodiment.
Figure 7B:
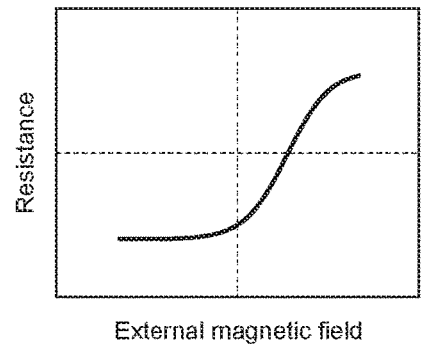
FIG. 7B is a graph schematically showing an output waveform of the MR elements of the third resistive element section of this embodiment.

The configuration of each of the resistive element sections will be described below with reference to FIG. 5A to FIG. 7B. FIG. 5A, FIG. 6A and FIG. 7A are respectively schematic plan views of first, second and third resistive element sections, and each shows a plane perpendicular to the film forming direction of the MR element. Further, each of FIG. 5B, FIG. 6B and FIG. 7B schematically shows the behavior (output waveform) of the resistance of the MR element with respect to the external magnetic field in each of the first, second and third resistive element sections. The first, second and third resistive element sections differ from each other only as regards the arrangement of the bias magnetic field generating section. Hence, the configuration of the first resistive element section will be described in detail below, and only the arrangement of the bias magnetic field generating section of each of the second and third resistive element sections will be described below.

As shown in FIG. 5A, first resistive element section 50 includes a substrate (not shown), MR element 30 that is arranged on the substrate, and bias magnetic field generating section 51 that is also arranged on the substrate. Bias magnetic field generating section 51 includes at least one hard magnet which applies a bias magnetic field to free layer 34 of MR element 30. In this embodiment, bias magnetic field generating section 51 is composed of a pair of hard magnets 52 and 53 which are arranged to be spaced apart with MR element 30 interposed therebetween. Each of hard magnets 52 and 53 is arranged to be spaced apart from MR element 30.

In first resistive element section 50, hard magnets 52 and 53 of bias magnetic field generating section 51 are arranged such that the longitudinal direction of each of hard magnets 52 and 53 is parallel to the x-axis. In this case, since the magnetization direction of each of hard magnets 52 and 53 is perpendicular to the x-axis, there is no x-axis component of the magnetic field that acts on free layer 34. For this reason, as shown by the white arrow of FIG. 5A, offset magnetic field $H_{in}$ of MR element 30 remains unchanged. As a result, in first resistive element section 50, the resistance of MR element 30 exhibits the behavior as shown in FIG. 5B.

Bias magnetic field generating section 61 of second resistive element section 60 differs from bias magnetic field generating section 51 of first resistive element section 50 as regards the relative position with respect to MR element 30. Specifically, in second resistive element section 60, hard magnets 62 and 63 of bias magnetic field generating section 61 are arranged such that the longitudinal direction of each of hard magnets 62 and 63 is inclined by a predetermined angle relative to the x-axis. In this case, although the magnetization direction of each of hard magnets 62 and 63 is perpendicular to the x-axis, the bias magnetic field applied to free layer 34 of MR element 30 has a positive x-axis component. Thereby, in second resistive element section 60, the positive x-axis component of the bias magnetic field becomes large. As a result, offset magnetic field $H_{in}$ of MR element 30 is offset by the x-axis component of the bias magnetic field, and hence the resistance of MR element 30 exhibits the behavior as shown in FIG. 6B.

Bias magnetic field generating section 71 of third resistive element section 70 differs from bias magnetic field generating section 51 of first resistive element section 50 and bias magnetic field generating section 61 of second resistive element section 60 as regards the relative position with respect to MR element 30. Specifically, in third resistive element section 70, hard magnets 72 and 73 of bias magnetic field generating section 71 are arranged such that, as shown in FIG. 7A, the longitudinal direction of each of hard magnets 72 and 73 is more inclined with respect to the x-axis as compared with the case of the second resistive element section 60. Thereby, in third resistive element section 70, the positive x-axis component of the bias magnetic field becomes even larger. As a result, offset magnetic field $H_{in}$ of MR element 30 is positive, and hence, in third resistive element section 70, the resistance of MR element 30 exhibits the behavior as shown in FIG. 7B.

In the examples shown in FIG. 5A to FIG. 7B, the magnetization direction of each of the hard magnets is fixed in the y-axis positive direction. However, the magnetization direction is not limited to this. Magnetization directions may be respectively fixed with respect to the hard magnets, and for example, may be respectively fixed parallel to the transverse direction of the hard magnets. That is, in second resistive element section 60, the magnetization direction of each of hard magnets 52 and 53 may be inclined by a predetermined angle relative to the y-axis, and in third resistive element section 70, the magnetization direction of each of hard magnets 52 and 53 may be more inclined with respect to the y-axis as compared with the case of the second resistive element section 60.

Figure 8:
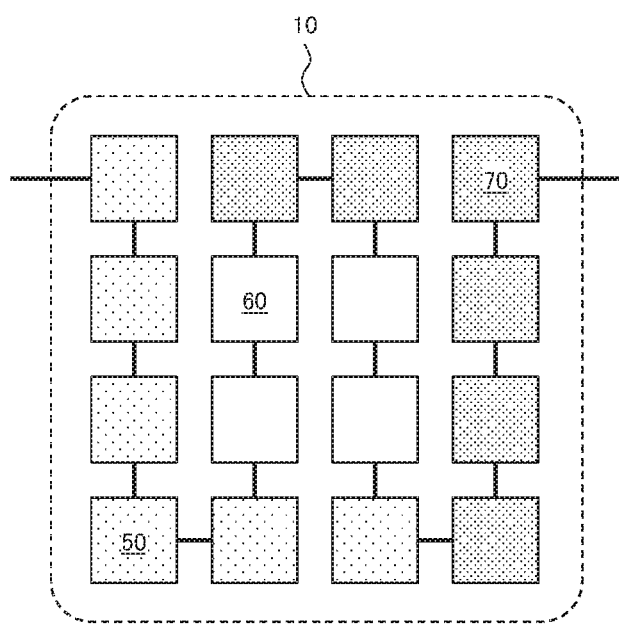
FIG. 8 is a schematic view showing an example of a configuration of the first resistor array of this embodiment.

FIG. 8 is a schematic view showing an example of the configuration of first resistor array 10. In the shown example, first resistor array 10 includes six first resistive element sections 50, four second resistive element sections 60, and six third resistive element sections 70. However, the number of each of the resistive element sections is not limited to this. Further, in the shown example, the group of first resistive element sections 50 and the group of third resistive element sections 70 are arranged in rotational symmetry with respect to the group of second resistive element sections 60. However, the resistive element sections need not necessarily be arranged in the regular pattern. For example, in the case where the external magnetic field is uniformly applied to first resistor array 10, first resistive element section 50, second resistive element section 60, and third resistive element section 70 may be randomly arranged.

With the above configuration, the output waveform (i.e., the external magnetic field dependence of the resistance) of first resistor array 10 can be obtained by superimposing the output waveforms of MR elements 30 in resistive element sections 50, 60 and 70 as respectively shown in FIG. 5B, FIG. 6B and FIG. 7B. The output waveform obtained by the superimposition has a wider linear region as compared with the output waveform of each of MR elements 30. On the other hand, even when the output waveforms of MR elements 30 are superimposed, the maximum value and the minimum value of the output waveform obtained by the superimposition remain substantially unchanged. As a result, magnetic sensor 1 of this embodiment enables improving the linearity of the output while minimizing any reduction in the MR ratio.

The resistor array only needs to be configured such that the output characteristic curves of the MR elements are changed for each of the resistive element sections in order to improve the linearity of the output characteristic curve of the resistor array as described above. Therefore, the types (groups) of the resistive element sections are not limited to the above-described three types. The resistor array only needs to include at least two types of resistive element sections, and the resistor array may include four or more types of resistive element sections.

Each of FIGS. 9A to 9C, FIGS. 10A to 10C, and FIGS. 11A to 11C is a schematic plan view showing a modification of the bias magnetic field generating section of this embodiment. Each of the views in FIG. 9A, FIG. 10A and FIG. 11A corresponds to the view in FIG. 5A, and each of the views in FIG. 9B, FIG. 10B and FIG. 11B corresponds to the view in FIG. 6A. Further, each of the views in FIG. 9C, FIG. 10C and FIG. 11C corresponds to the view in FIG. 7A.

Figure 9A:
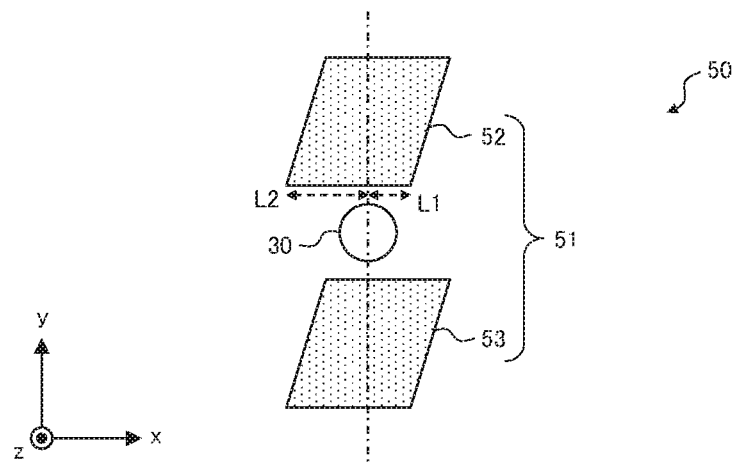
FIGS. 9A to 16 are each a schematic plan view showing a modification of a bias magnetic field generating section of this embodiment.
Figure 9B:
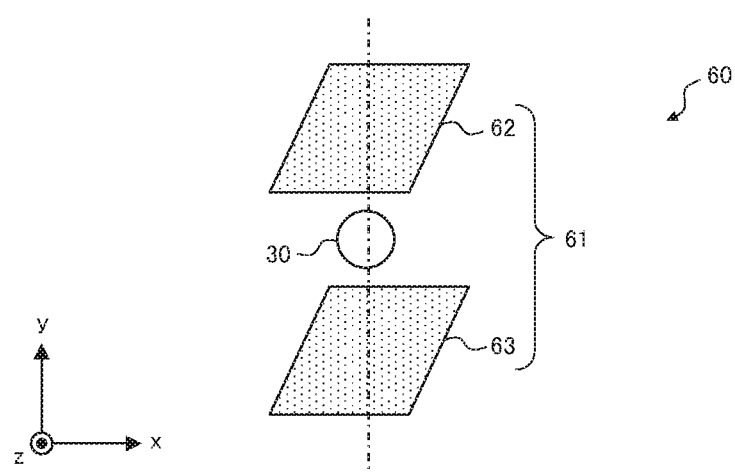
Figure 9C:
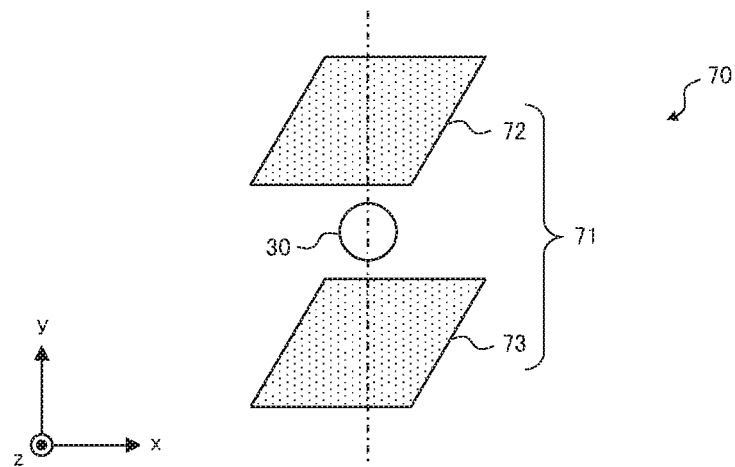

In the modification shown in FIG. 9A to FIG. 9C, planar shapes of bias magnetic field generating sections 51, 61 and 71 are different from each other. Specifically, each of bias magnetic field generating sections 51, 61 and 71 has a different ratio between the distance (see arrow L1 in FIG. 9A) from the straight line that is parallel to the y-axis and that passes through the center of MR element 30, to a vertex of the hard magnet (parallelogram), and the distance (see arrow L2 in FIG. 9A) from the straight line to the other vertex of the hard magnet. With this configuration, the x-axis component of the bias magnetic field that acts on free layer 34 of MR element 30 is changed for each of resistive element sections 50, 60 and 70 so that the magnitude of offset magnetic field $H_{in}$ can be changed.

Figure 10A:
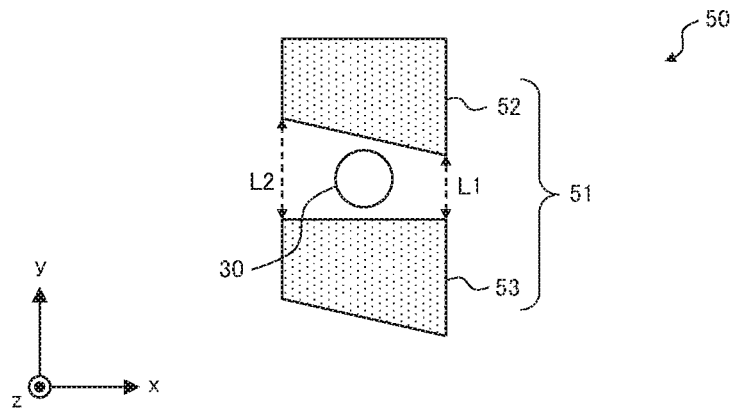
Figure 10B:
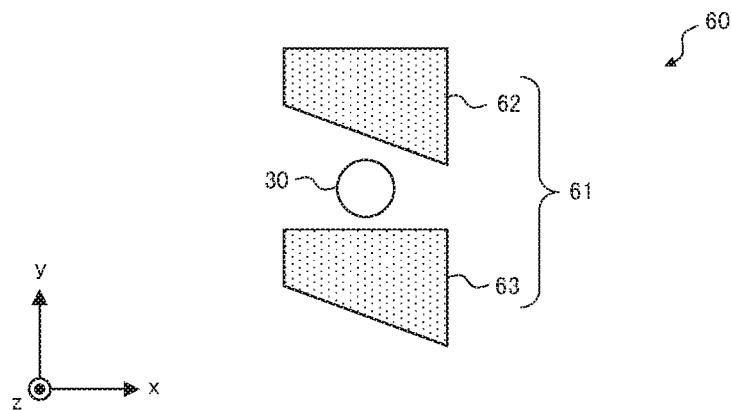
Figure 10C:
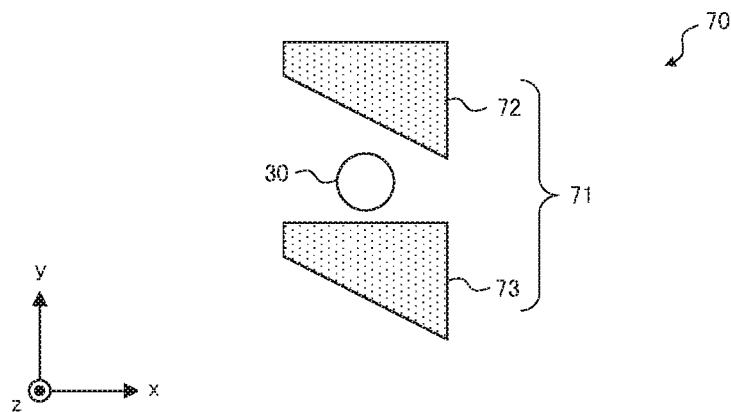

In the modification shown in FIG. 10A to FIG. 10C, planar shapes of bias magnetic field generating sections 51, 61 and 71 are different from each other. Specifically, each of bias magnetic field generating sections 51, 61 and 71 has a different ratio between the y-axis distance (see arrow L1 in FIG. 10A) from one end of one of the hard magnets to one end of the other of the hard magnets, and the y-axis distance (see arrow L2 in FIG. 10A) from the other end of the one of the hard magnets to the other end of the other of the hard magnets. With this configuration, the same effect as in the modification shown in FIG. 9A to FIG. 9C can be obtained.

Figure 11A:
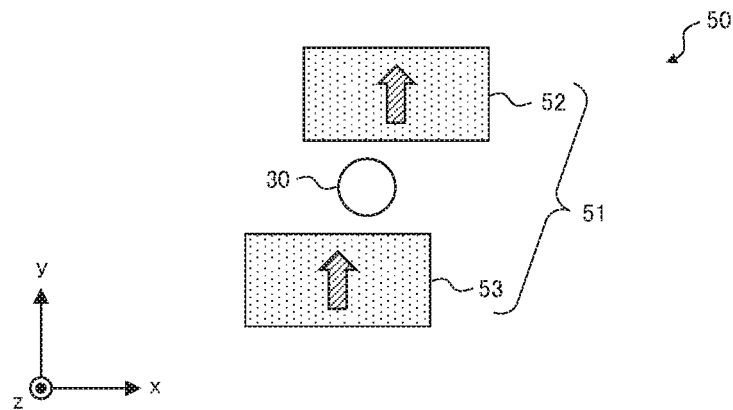
Figure 11B:
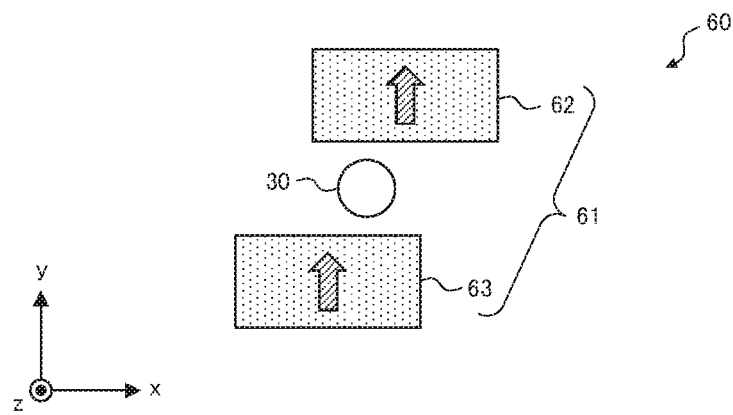
Figure 11C:
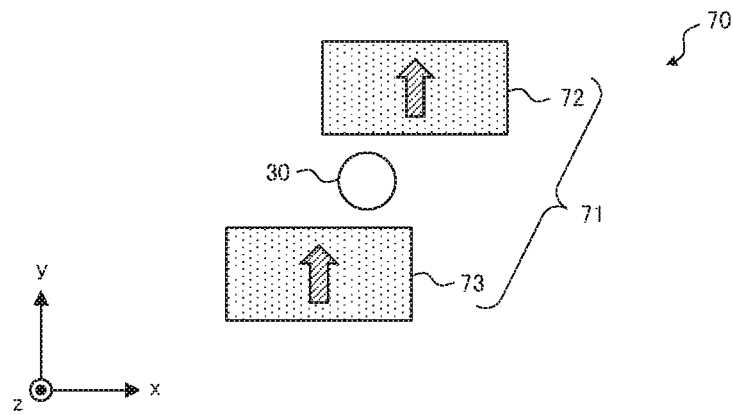

In the modification shown in FIG. 11A to FIG. 11C, similarly to the configurations shown in FIG. 5A to FIG. 7A, relative positions of bias magnetic field generating sections 51, 61 and 71 with respect to MR element 30 are different from each other. In this modification, instead of changing the amount of inclination (i.e., the amount of rotation) of the hard magnet as shown in FIG. 5A to FIG. 7B, each of resistive element sections 50, 60 and 70 has a different distance between the two hard magnets in the x-axis direction. With this configuration, the same effect as in the above-described modifications can be obtained.

The bias magnetic field generating section only needs to change the x-axis component of the bias magnetic field that acts on the free layer for each of the resistive element sections. For this reason, unlike in the embodiment and modifications as described above, the shape and position of the bias magnetic field generating section (hard magnet) need not necessarily be changed systematically for each of the resistive element sections. Therefore, for example, one of three resistive element sections in one resistor array may have any one from among the bias magnetic field generating sections configured as shown in the modifications in FIG. 9A to FIG. 11C. That is, the shape and position of the bias magnetic field generating section (hard magnet) may be changed randomly for each of the resistive element sections, and hence various combinations of bias magnetic field generating sections can be used in the resistor array.

Further, various changes to the shape and position of the bias magnetic field generating section (hard magnet) can also be made.

Figure 12:
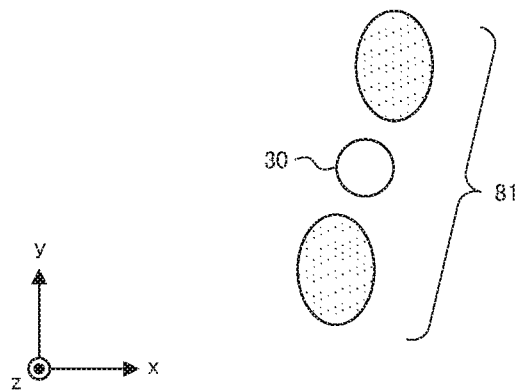

The shape of the bias magnetic field generating section viewed from the z-axis direction, i.e., the planar shape of the bias magnetic field generating section may not be rectangular as in the embodiment and the modifications as described above, and may be polygonal. In this case, the corners of a rectangle or a polygon may be round. Further, the planar shape of the bias magnetic field generating section may also be circular or elliptical as shown in FIG. 12. Also, the planar shape of the bias magnetic field generating section may be formed by any curves. Alternatively, the planar shape of the bias magnetic field generating section may also be formed by a combination of straight lines and curves.

Figure 13:
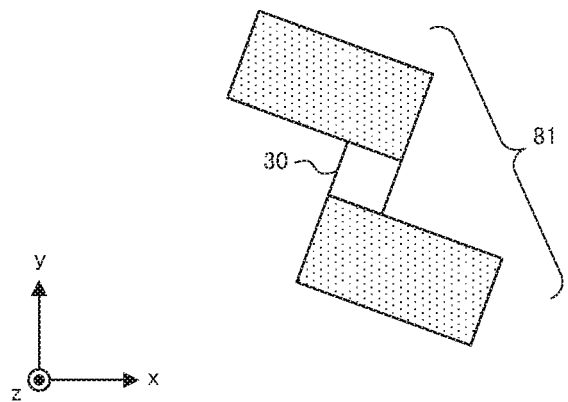

Further, the bias magnetic field generating section only needs to be able to apply the bias magnetic field to the MR element, and the position of the bias magnetic field generating section is not limited to any particular position. In the embodiment and modifications as described above, the bias magnetic field generating section is located away from the MR element when viewed from the z-axis direction. However, as shown in FIG. 13, the bias magnetic field generating section may be located to contact the MR element, or may also be located to overlap a portion of the MR element. Alternatively, the bias magnetic field generating section may be located to cover the MR element so as to completely overlap the MR element. Further, in the embodiment and modifications as described above, the bias magnetic field generating section is symmetrically located with respect to the MR element when viewed from the z-axis direction. However, the bias magnetic field generating section may not necessarily be located at the symmetrical position. Therefore, for example, the bias magnetic field generating section may be located such that one hard magnet is in contact with the MR element and the other hard magnet is away from the MR element. Alternatively, two hard magnets of the bias magnetic field generating section may be located on one side of the MR element.

The same also applies to the cross-sectional shape and position of the bias magnetic field generating section in the z-axis direction. That is, when viewed from the direction perpendicular to the z-axis, similarly to the case of the planar shape described above, the bias magnetic field generating section may have various geometrical shapes, and may be located at various positions. For example, the z-axis position of the bias magnetic field generating section may be different from the z-axis position of the MR element, and two hard magnets of the bias magnetic field generating section may be positioned to be mutually shifted in the z-axis direction. Alternatively, the bias magnetic field generating section may be asymmetrically located with respect to the MR element, and two hard magnets of the bias magnetic field generating section may be located on one side of the MR element.

Figure 14:
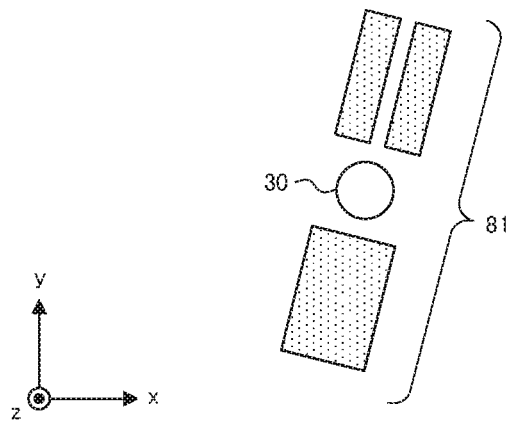

Further, in the embodiment and modifications as described above, the bias magnetic field generating section is composed of two hard magnets. However, the number of the hard magnets of the bias magnetic field generating section is not limited to two. For example, when viewed from the z-axis direction, or when viewed from a direction perpendicular to the z-axis, the bias magnetic field generating section that has only one hard magnet may be provided on one side of the MR element. Alternatively, as shown in FIG. 14, the bias magnetic field generating section may be composed of three hard magnets, and may be composed of three or more hard magnets.

Figure 15:
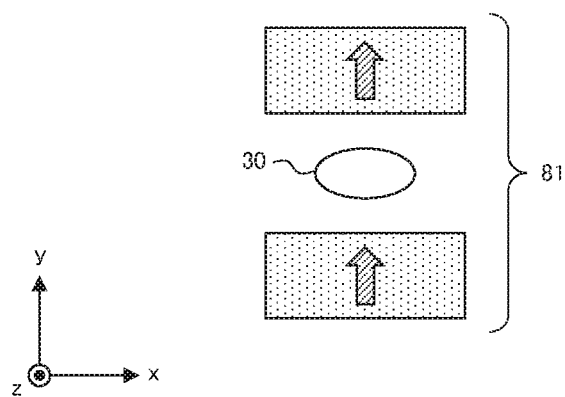
Figure 16:
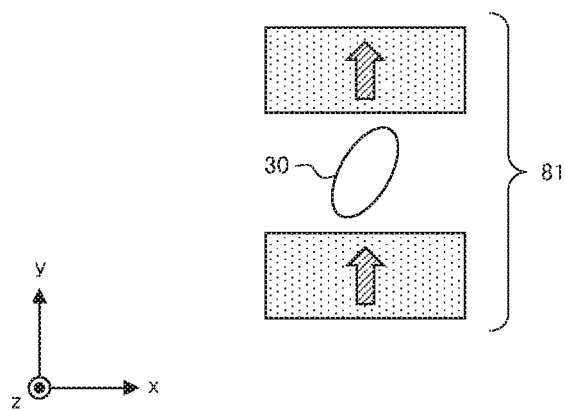

On the other hand, similarly to the bias magnetic field generating section, various changes to the shape and position of the MR element can also be made. For example, the shape of the MR element viewed from the z-axis direction, i.e., the planar shape of the MR element may not be circular as in the embodiment and modifications as described above, and may be elliptical as shown in FIG. 15. Alternatively, the MR element may be formed by any curves, and may also be formed by a combination of straight lines and curves. Further, the planar shape of the MR element may be rectangular (see FIG. 13) or polygonal. In this case, the corners of a rectangle or a polygon may be rounded. Further, the MR elements may not be located at the symmetrical position as in the embodiment and modifications as described above. For example, in the case where the planar shape of the MR element is elliptical, the long axis of the ellipse may be inclined relative to the x-axis and y-axis, as shown in FIG. 16. Further, the cross-sectional shape along the z-axis direction of the MR element may not be rectangular as shown in FIG. 3B.

In this embodiment including the above-described modifications, the x-axis component of the bias magnetic field applied to the free layer of the MR element is changed for each of the resistive element sections, and thereby the magnitude of the offset magnetic field is changed so that the output characteristic curve of the MR element is changed for each of the resistive element sections. However, the method of changing the output characteristic curve of the MR element is not limited to this. For example, a method using the shape magnetic anisotropy of the free layer as described above by changing the planar shape of the MR element (i.e., the planar shape of the free layer) for each of the resistive element sections, can also be used. In this case, due to the shape magnetic anisotropy, the magnetization of the free layer can be easily directed to the easy direction of magnetization (for example, the long axis direction of the ellipse when the planar shape of the MR element is elliptical as shown in FIG. 15 and FIG. 16). That is, the method using the shape magnetic anisotropy of the free layer has an effect of preventing change of the magnetization direction of the free layer similarly to the method in which the bias magnetic field is applied to the free layer. Therefore, in the method using the shape magnetic anisotropy of the free layer, it is not necessary to apply the bias magnetic field to the free layer, and hence the bias magnetic field generating section described above need not be necessarily provided.

In the following, with reference to the results of calculating the output waveforms of resistor arrays, effects of this embodiment will be described in which the resistor array includes a plurality of MR elements having different output characteristic curves.

Figure 17:
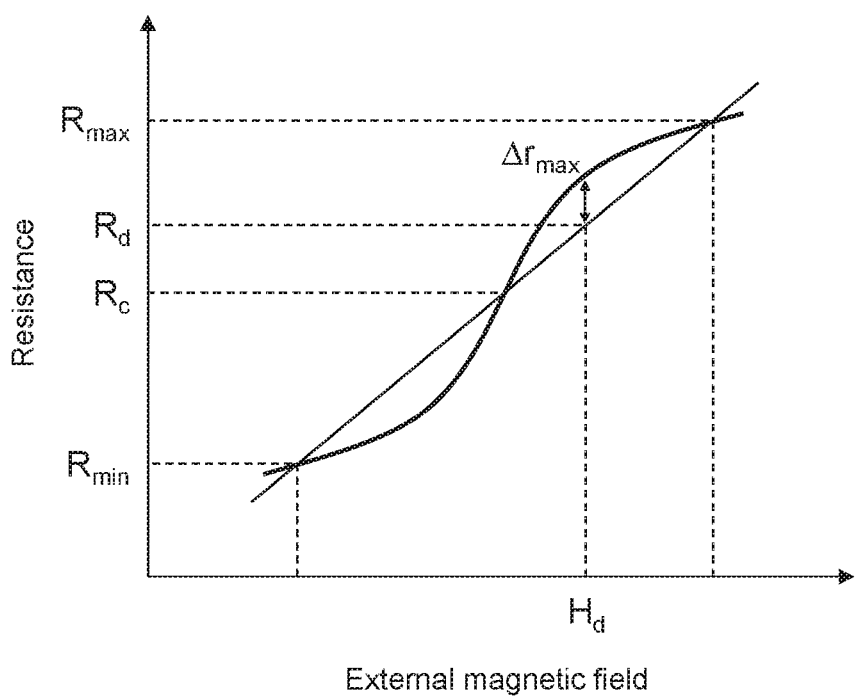
FIG. 17 is a graph schematically showing an example of an output waveform of the resistor array including a plurality of the MR elements.

First, before describing the calculation, the definition of the MR ratio of the resistor array and the definition of the maximum deviation amount used as an indicator of the linearity of the output will be described with reference to FIG. 17. FIG. 17 schematically shows an example of an output waveform of the resistor array including a plurality of the MR elements. The maximum and minimum values of the resistance within a predetermined magnetic field range are respectively defined as $R_{max}$ and $R_{min}$. The intermediate value between the maximum and minimum values is defined as $R_c$ $(=(R_{max}+R_{min})/2)$, and the MR ratio is defined as $(R_{max}-R_{min})/R_c$. On the other hand, a straight line that connects two points corresponding to maximum value $R_{max}$ and minimum value $R_{min}$ of the resistance is defined as a reference line, and then the deviation between the reference line and the output assumes a maximum value, $\Delta r_{max}$, when the external magnetic field is $H_d$. When the value of the reference line at external magnetic field $H_d$ is defined as $R_d$, the maximum deviation amount (percentage) is defined as $\Delta r_{max}/R_d$.

Numerical simulations of output waveforms of resistor arrays were performed, using assumed models, in the following three cases. Then, in each of the following cases, the MR ratio and the maximum deviation amount as described above were calculated from the obtained output waveform. The MR ratio was calculated from the maximum value and the minimum value of the resistance in the magnetic field range of ±30 mT. It should be noted that, in each of the following cases, the MR element included in the resistor array was assumed to be the MR element shown in FIG. 2 and to have the same film configuration.

(Case 1)

It was assumed that the resistor array included twenty four TMR elements that were connected in series with each other and that had different output characteristic curves. Specifically, it was assumed that the TMR elements were classified into five types (groups) according to the intensity of offset magnetic field $H_{in}$ in the x-axis direction (see FIG. 2) with respect to the free layer. More specifically, according to the intensity of the offset magnetic field $H_{in}$, the twenty four of TMR elements were classified into five groups consisting of a group having four TMR elements each having the intensity of 30 mT, a group having five TMR elements each having the intensity of 18 mT, a group having six TMR elements each having the intensity of 0 mT, a group having five TMR elements each having the intensity of −18 mT, and a group having four TMR elements each having the intensity of −30 mT.

(Case 2)

It was assumed that the resistor array included twenty four TMR elements that were connected in series with each other and that had the same output characteristic curve. Further, it was assumed that, in each of the TMR elements, the offset magnetic field $H_{in}$ with respect to the free layer was set to zero, and instead, a bias magnetic field having the intensity of 146.97 mT was applied in the direction perpendicular to the magnetization direction of the pinned layer (i.e., in the y-axis direction in FIG. 2). Therefore, it was assumed that, when the external magnetic field was zero, the magnetization of the free layer was oriented to the direction of the bias magnetic field (i.e., the direction perpendicular to the magnetization direction of the pinned layer). It should be noted that Case 2 is equivalent to the configuration to which the method described in JP 07-092199 A is applied.

(Case 3)

It was assumed that the resistor array included twenty four TMR elements that were connected in series with each other and that had the same output characteristic curve. Further, it was assumed that, in each of the TMR elements, the offset magnetic field $H_{in}$ with respect to the free layer was set to zero, and the bias magnetic field was not applied in the y-axis direction.

Table 1 shows the calculation results of the MR ratio and the maximum deviation amount in the three cases.

TABLE 1

|  | Case 1 | Case 2 | Case 3 |
| --- | --- | --- | --- |
| MR ratio [%] | 41 | 27 | 50 |
| Maximum deviation amount [%] | 0.2 | 0.5 | 8.7 |

From Table 1, it can be seen that, as compared with Case 3, the maximum deviation amount in each of Case 1 and Case 2 is substantially reduced so that the linearity of each of the outputs is greatly improved. On the other hand, although the MR ratio in each of Case 1 and Case 2 is reduced as compared with Case 3, the amount of reduction of the MR ratio in Case 1 is smaller than in Case 2. Specifically, the MR ratio in Case 1 is reduced only by 18%, while the MR ratio in Case 2 is reduced by as much as 46%. This means that, in Case 1 (this embodiment), the linearity of the output of the resistor array can be improved while minimizing the reduction in the MR ratio of the resistor array.

In the above-described embodiment, the MR elements are connected in series with each other in the resistor array. However, the connection of the MR elements is not limited to this. The connection of the MR elements may be a parallel connection, or the connection of the MR elements may be a combination of series and parallel connections.

While preferred embodiments of the present invention have been shown and described in detail, and it is to be understood that variety of changes and modifications may be made without departing from the spirit of scope of the following claims or its scope.

What is claimed is:

1. A magnetic sensor for detecting a component of an external magnetic field in a specific direction, comprising a plurality of resistive element sections that are connected to each other to form a resistor array, each of the plurality of resistive element sections having only one magnetoresistance element,
wherein each of the plurality of resistive element sections has a different output characteristic curve with respect to the component of the external magnetic field in the specific direction, and
wherein the output characteristic curve of each of the plurality of resistive element sections is the behavior of the resistance of a respective resistive element section with respect to the external magnetic field.

2. The magnetic sensor according to claim 1, wherein the plurality of resistive element sections are classified into at least two groups of resistive element sections including a first group and a second group, and each of the first group and the second group has a different output characteristic curve with respect to the component of the external magnetic field in the specific direction.

3. The magnetic sensor according to claim 1, wherein the magnetoresistance element includes a pinned layer whose magnetization direction is fixed, a free layer whose magnetization direction is changed according to the external magnetic field, and a spacer layer which is interposed between the pinned layer and the free layer.

4. The magnetic sensor according to claim 3, wherein
the pinned layer of the magnetoresistance element is made up of a plurality of separate pinned layers in the plurality of resistive element sections, respectively,
the free layer of the magnetoresistance element is made up of a plurality of separate free layers in the plurality of resistive element sections, respectively, and
the magnetization of the plurality of separate pinned layers in the pinned layer of the magnetoresistance element are fixed along the specific direction, and an easy axis of magnetization of the plurality of separate free layers in the free layer have different directions for each of the plurality of separate free layers.

5. The magnetic sensor according to claim 4, wherein each of the resistive element sections further includes a bias magnetic field generating section which applies a bias magnetic field to the magnetoresistance element, and the bias magnetic field applied to the free layer of the magnetoresistance element in each of the plurality of resistive element sections has a different intensity in the specific direction.

6. The magnetic sensor according to claim 5, wherein the bias magnetic field generating section in each of the plurality of resistive element sections has a different relative position with respect to the magnetoresistance element.

7. The magnetic sensor according to claim 5, wherein the bias magnetic field generating section in each of the plurality of resistive element sections has a different shape in a plane perpendicular to a film forming direction of the magnetoresistance element.

8. The magnetic sensor according to claim 4, wherein the free layer of the magnetoresistance element in each of the plurality of resistive element sections has a different shape magnetic anisotropy.

9. The magnetic sensor according to claim 3, wherein the magnetoresistance element is a tunnel magnetoresistance element using a tunnel barrier layer as the spacer layer.

10. The magnetic sensor according to claim 1, wherein a plurality of the resistor arrays form a bridge circuit.

11. The magnetic sensor according to claim 1, wherein each of the plurality of resistive element sections includes a plurality of resistive elements, each of the plurality of resistive elements in a given resistive element section having a same output characteristic curve with respect to the component of the external magnetic field in the specific direction.

* * * * *